United States Patent [19]
Grasso

[11] Patent Number: 5,949,243
[45] Date of Patent: Sep. 7, 1999

[54] TRANSLATOR FIXTURE FOR USE IN CIRCUIT BOARD TESTING

[75] Inventor: Jim Grasso, Salem, N.H.

[73] Assignee: Star Technology Group, Inc., Nashua, N.H.

[21] Appl. No.: 08/807,324

[22] Filed: Feb. 27, 1997

[51] Int. Cl.$^6$ .................................................. G01R 31/02
[52] U.S. Cl. ........................................ 324/761; 324/754
[58] Field of Search ..................................... 324/761, 754

[56] References Cited

U.S. PATENT DOCUMENTS

| | | | |
|---|---|---|---|
| 4,721,908 | 1/1988 | Driller et al. | 324/158 |
| 5,450,017 | 9/1995 | Swart | 324/754 |
| 5,493,230 | 2/1996 | Swart et al. | 324/754 |
| 5,633,598 | 5/1997 | Van Loan | 324/761 |
| 5,773,988 | 6/1998 | Sayre | 324/761 |
| 5,818,248 | 10/1998 | St. Onge | 324/761 |

*Primary Examiner*—Josie Ballato
*Assistant Examiner*—Thomas Valone
*Attorney, Agent, or Firm*—Hayes Soloway Hennessey Grossman & Hage PC

[57] ABSTRACT

A translator fixture for use in testing a printed circuit board is provided. The fixture includes a plurality of translator plates for containing and supporting translator pins extending through the translator plates for positioning the translator pins for contacting test points on the circuit board, and a plurality of supports. Each of the supports includes a central portion and is mounted through a respective group of holes in the translator plates. The holes each include respective, substantially identically dimensioned central apertures that are oversized with respect to the central portions of the supports. At least one hole in each of the groups of holes includes at least one peripheral aperture extending outwardly from a periphery of the central aperture of the one hole. Each of the supports also includes at least first and second support surfaces extending from the central portion for supporting at least two translator plates, respectively, in spaced apart, substantially parallel relationship with each other. The second support surface is undersized compared to the at least one peripheral aperture.

17 Claims, 8 Drawing Sheets

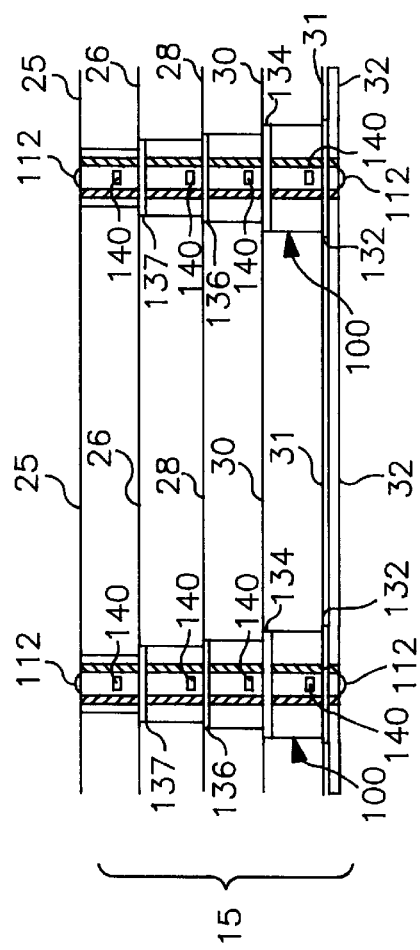
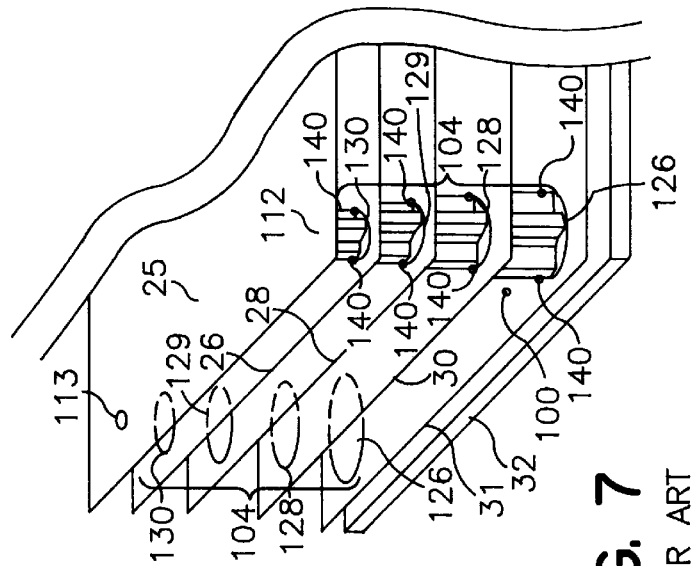
FIG. 4
FIG. 7 PRIOR ART
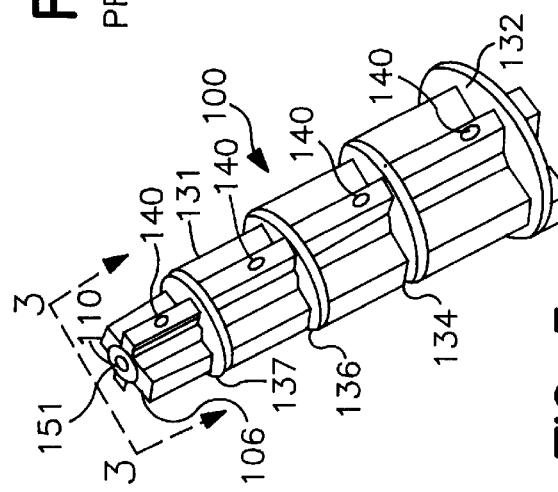
FIG. 5 PRIOR ART

TRANSLATOR FIXTURE FOR USE IN CIRCUIT BOARD TESTING

BACKGROUND OF THE INVENTION

1. Field of the Invention

The present invention relates generally to apparatus for electrically testing a printed circuit board. More specifically, the present invention is related to so-called "determined" grid test fixtures in which a translator pin fixture is used for translating electrical current from an off-grid pattern on a board under test to the channels of a tester in which the channel contacts are arranged in a grid pattern, and wherein the translator pin fixture comprises a plurality of guide plates which are held in spaced apart, essentially parallel relationship to each other by means of a plurality of fasteners and spacers.

2. Brief Description of Related Prior Art

Automatic test equipment for checking printed circuit boards has long involved the use of "bed of nails" test fixtures on which the circuit board is mounted during testing. A typical test fixture includes a large number of nail-like spring-loaded test probes arranged to make electrical contact between measurement channels in the test equipment and designated test points on the circuit board under test, also referred to as the unit under test or "UUT". Any particular circuit laid out on a printed circuit board is likely to be different from other circuits, and consequently, the arrangement of test probes for contacting test points on the board must be customized in a test fixture for that particular circuit board. Board design and fabrication data is used to determine what specific board features are to be tested by the fixture. A grid test fixture is typically fabricated by drilling patterns of holes in several rigid and nonconducting plates, assembling those plates with suitable fasteners and spacers to maintain said plates in a parallel, aligned position, and then mounting test pins or probes in the drilled holes. In a "determined" grid test fixture each plate has a hole pattern which is unique such that the test pin can only be inserted to provide an x, y and z translation between a unique feature on the UUT and a unique tester grid channel. In preparation for test, the circuit board is then positioned on the fixture precisely aligned with the array of test probes. During testing, the pins in the fixture are brought into spring-pressure contact with the test points on the circuit board under test. Electrical test signals are then transferred between the board and the tester through the fixture so that a high speed electronic test analyzer which detects continuity or lack of continuity between various test points in the circuits on the board can perform the actual test.

Further details of prior art fixtures are found, for example, in U.S. Pat. No. 5,493,230 and U.S. Pat. No. 4,721,908.

Referring to FIGS. 1–3, in one such conventional translator pin fixture, the translator plates 25A, 26A, 28A, 30A, 31A, 32A are held together in spaced apart, essentially parallel relationship to each other by a plurality of rigid, cylindrical support post assemblies 10 mounted normally to the plates. Typically, each of such support post assembly 10 consists of an elongate shaft or rod 11 which extends through coaxial holes 16A, 16B, 16C and 16D drilled in the intermediate plates 26A, 28A, 30A and 31A, respectively, i.e., the plates in-between the top plate 20A and bottom plate 20B of the fixture. A plurality of stacked cylindrical spacers or washers 12A, 12B, 12C, 12D and 12E are mounted on rod 11. The diameter of rod 11 is slightly smaller than the diameters of the coaxial holes through which it extends, while the diameters of spacers 12A, 12B, 12C, 12D and 12E are larger than the diameters of the coaxial holes 16A, 16B, 16C and 16D whereby the plates are spaced apart, in essentially parallel relationship to each other. The fixture is held together by screws 22A, 22B through holes in the top and bottom plates and into threaded holes (not shown) in the top and bottom ends of rod 11.

Unfortunately, constructing the aforesaid type of conventional translator fixture is difficult, slow, and requires a significant amount of manual labor and parts inventory. These factors can significantly increase the expense and time of manufacture of the aforesaid type of conventional translator fixture.

Another type of prior art translator pin fixture is shown in FIGS. 4–8. In this type of prior art fixture 15, the translator plates 25, 26, 28, 30, 31, 32 are held together in spaced apart, essentially parallel relationship with each other by a plurality of support elements 100. Each of the support elements 100 has planar top (proximal) 106 and bottom (distal) 108 ends. Ends 106, 108 include threaded holes 110, 111 for receiving screws 112 which pass through holes (collectively referred to by numeral 113) in the plates 25 and 32 so as to affix the top plate 25 and bottom plate 32 to the ends 106, 108 of each of the supports 100. As will be described more fully below, each of the support elements 100 is mounted through a respective group of coaxially aligned holes (each of which groups is collectively referred to by numeral 104) formed in the intermediate plates 26, 28, 30, 31 of the fixture 15.

In each of the groups of mounting holes 104, the holes increase in size in the direction from the top plate 25 to the bottom plate 32. In other words, in each group of coaxial holes 104, the holes (collectively referred to by numeral 126) formed in the bottom-most intermediate plate 31 are larger in diameter than the holes (collectively referred to by numeral 128) formed in intermediate plate 30, which holes 128 are larger in diameter than the holes (collectively referred to by numeral 129) formed in the next intermediate plate 28. Likewise, holes 130 formed in the top-most intermediate plate 26 are smaller than holes 128. Additionally, plate mounting holes 113 are significantly smaller in diameter than the coaxial holes 126, 128, 129, 130 formed in the intermediate translator plates 31, 30, 28, 26, respectively.

Preferably, each support element 100 is made of one-piece, molded plastic construction, and comprises a X-shaped longitudinal support rib 131 which extends from the top 106 to the bottom 108 end of the support element 100. Each support element 100 includes a plurality of disk-shaped support areas 132, 134, 136, 137 that are coaxial with the central portion 151 of the rib 131, spaced apart longitudinally along the length of the support element 100, and oriented normal to the rib 131. Support areas 132, 134, 136, 137 extend beyond the edges of the holes 126, 128, 129, 130, respectively, and engage and support the undersides of the intermediate plates 31, 30, 28, 26, adjacent to the holes 126, 128, 129, 130, respectively. A plurality of raised notches (collectively referred to by numeral 140) extend radially outward from rib 131 and are spaced apart longitudinally from the support areas 132, 134, 136, 137 by distances slightly larger than the thicknesses of the plates 31, 30, 28, and 26 so as to permit the plates to be locked snugly in-between the support areas 132, 134, 136, 137 and the notches 140.

As seen particularly in FIGS. 4 and 5, the transverse cross-sectional size of each of the support elements 100 increases in a step-wise fashion from the top end 106 to the bottom end 108 of the support element 100. Moreover, the transverse cross-sectional size of each of the support elements 100 in-between the top surface 106 and the first support area 137 is undersized compared to the holes 130 formed in the plate 26. At the first support area 136, the transverse cross-sectional size of each of the support elements 100 increases in step-wise fashion from that existing between the top end 106 and the first support area 137, so as to be oversized compared to the holes 130, but undersized compared to the holes 129. Between the first 137 and the second 136 support areas, the transverse cross-sectional size of each of the support elements 100 remains equal to that at the first support area 137. At the second 136 support area, the transverse cross-sectional size of each of the support elements 100 increases in step-wise fashion so as to be oversized compared to the holes 129, but undersized compared to the holes 128. Between the second 136 and the third 134 support areas, the transverse cross-sectional size of each of the support elements 100 remains equal to that at the second support area 136. At the third support area 134, the transverse cross-sectional size of each of the support elements 100 increases in step-wise fashion so as to be larger than the holes 128, but undersized compared to holes 126. Thereafter, the transverse cross-sectional size of each of the support elements 100 remains constant until, at the bottom-most support area 132, it increases in step-wise fashion so as to be greater than the holes 126, and remains constant thereafter to bottom end 108.

While assembly of prior art fixture 15 of FIGS. 4–8 may take somewhat less time, and manual labor than the prior art fixture of FIGS. 1–3, the time, and manual labor involved in construction of fixture 15 are still larger than desirable. This is due primarily to the fact that since holes 126, 128, 129, 130 each have different dimensions, a respective, differently sized hole typically must be formed in each of the plates 25, 26, 27, 28, 29, 30 and 31, in conventional fixture 15. Thus, in order to manufacture fixture 15, it is typically necessary to use multiple drilling apparatus having differently sized drill bits and/or to frequently change drill bits in order to form holes 126, 128, 129, 130, and/or inventory several different plates. Disadvantageously, this makes the expense, time, and manual labor required to manufacture fixtures larger than desirable.

OBJECTS OF THE INVENTION

It is therefore a general object of the present invention to provide a translator pin fixture for use with a circuit board testing apparatus that overcomes the aforesaid and other disadvantages and drawbacks of the prior art, and more specifically, to provide a translator fixture for use with circuit board testing apparatus whose construction can be effected more easily, quickly, and with less manual labor compared to the prior art.

SUMMARY OF THE INVENTION

In accordance with one preferred embodiment of the present invention, a translator fixture comprising a plurality of translator plates for containing and supporting translator pins extending through the translator plates, which plates are held in spaced relationship by a plurality of supports. Each of the supports is of one-piece construction, and is mounted through a respective group of holes in the translator plates. Each of the holes includes a respective, substantially identically dimensioned central aperture that is slightly oversized compared to the main body of the supports. The holes in the plates include peripheral apertures which are keyed to protrusions on the supports so as to locate the plates on the protrusions on the supports, i.e. at a selected level, in spaced apart, substantially parallel relationship with each other.

Preferably, each of the supports also includes a plurality of protrusions at selected levels, i.e. so as to provide support surfaces for holding the translator plates in spaced-apart, substantially parallel relationship with the one and other translator plates. Preferably, but not necessarily, each of the peripheral apertures are identically dimensioned.

Advantageously, construction of a translator fixture according to the present invention can be effected much more easily, quickly, and with less manual labor and expense compared to the prior art, and can be accomplished using drill bits of only two different sizes regardless of the number of translator plates in the fixture. Thus, assembly of a translator fixture according to the present invention requires substantially less time and is less expensive than in the prior art, and fewer parts to be inventoried.

BRIEF DESCRIPTION OF THE DRAWINGS

Other objects, features, and advantages of the present invention and embodiments thereof now will be described in detail below, with reference to the accompanying drawings, wherein like numerals depict like parts, and wherein:

FIG. 4 is a view, similar to FIG. 1 of another form of conventional translator fixture discussed previously;

FIG. 5 is a longitudinal cross-sectional view of the support of FIG. 4 taken along lines 5—5 in FIG. 4;

FIG. 7 is a view, similar to FIG. 3, of the conventional translator fixture of FIG. 4;

Although the following Detailed Description will proceed with reference being made to specific embodiments of the present invention, it should be understood that the present invention is not intended to be limited to these embodiments. Rather, many alternatives, modifications, and variations thereof will be apparent to those skilled in the art. Accordingly, the present invention should be viewed broadly, as being limited only as set forth in the hereinafter appended claims.

DETAILED DESCRIPTION OF PREFERRED EMBODIMENTS

Figure 1:
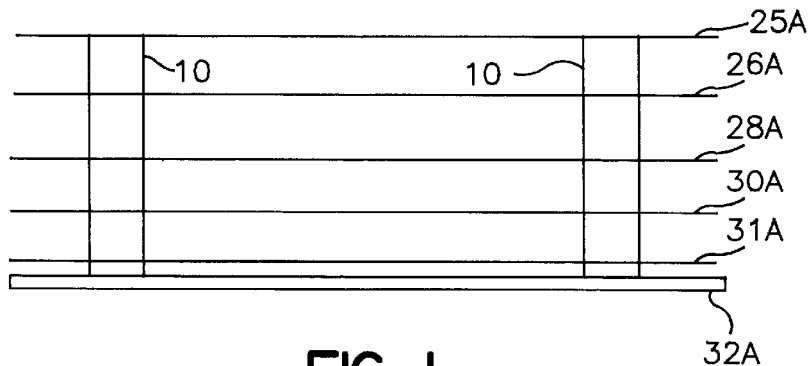
FIG. 1 is a side view of a conventional translator fixture discussed previously.
Figure 2:
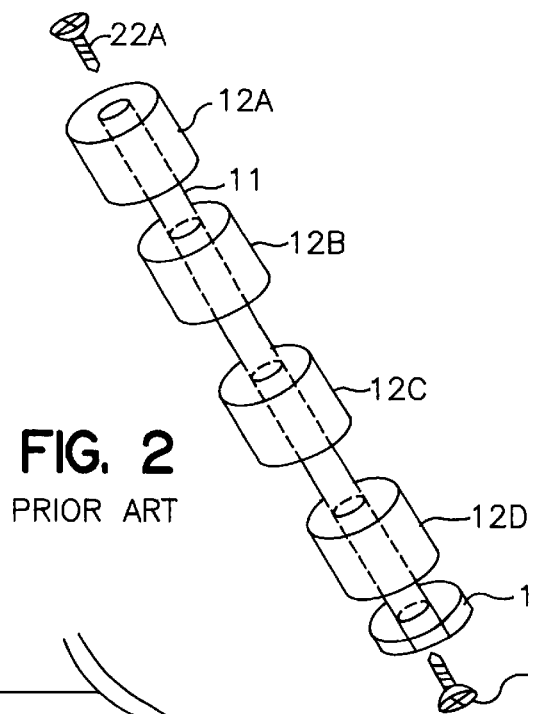
FIG. 2 is a side elevational exploded view of the support element for holding the translator plates in the conventional fixture of FIG. 1.
Figure 3:
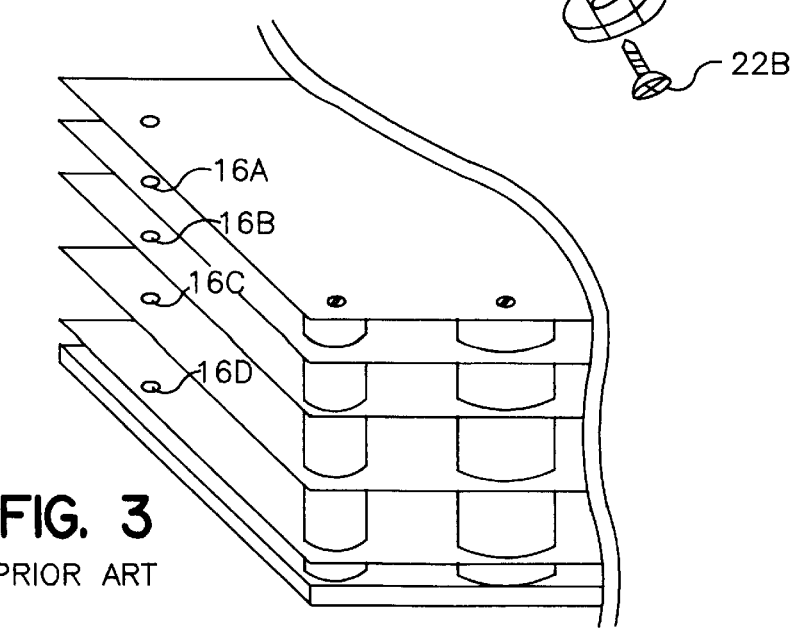
FIG. 3 is side elevational view of a portion of the conventional translator fixture of FIG. 1, in which view one of the supports has been removed from a group of holes and portions of elements have been shown in ghost to facilitate discussion of the features of said conventional fixture.
Figure 6:
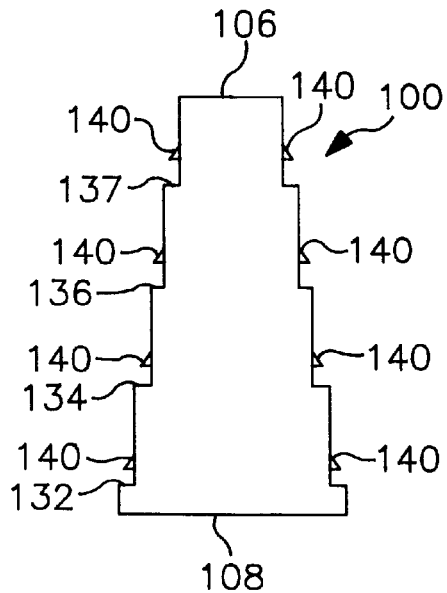
FIG. 6 is a view, similar to FIG. 2, of the support element of FIG. 4.
Figure 8:
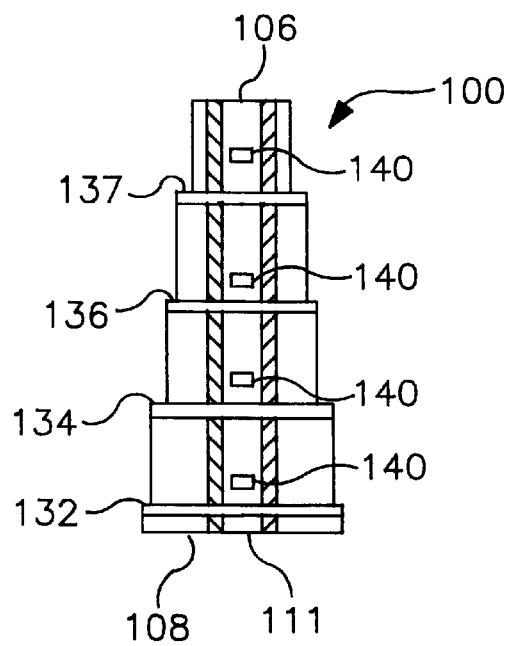
FIG. 8 is a side view of the conventional support of FIG. 6.
Figure 9:
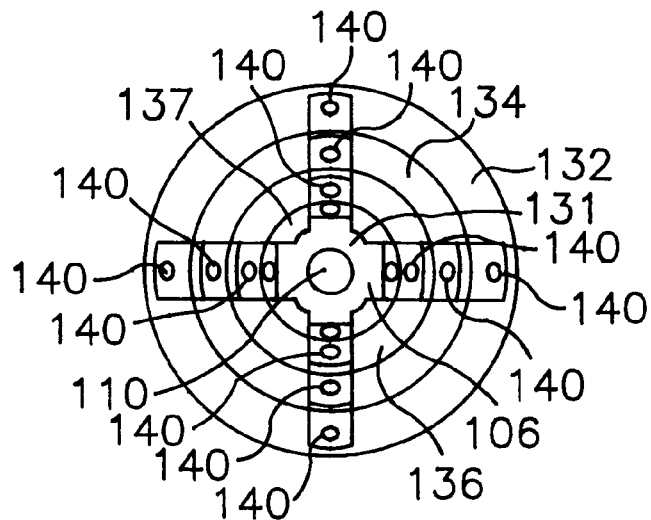
FIG. 9 is a top view of the conventional support of FIG. 6.
Figure 10:
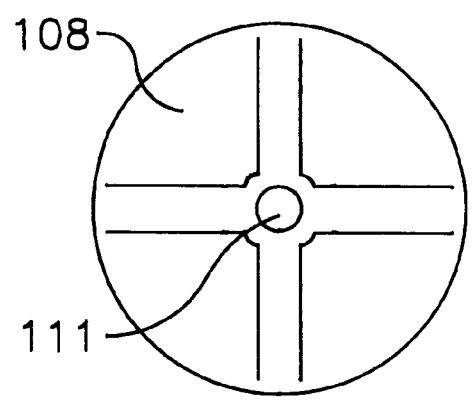
FIG. 10 is a bottom view of the conventional support of FIG. 6.

Referring to FIGS. 11–16, a circuit board testing apparatus 200 having one preferred embodiment 202 of the translator fixture system of the present invention will now be described. Apparatus 200 preferably includes a grid base 204 having an array of spring-loaded test probes 206 arranged on a two-dimensional grid pattern. The test probes illustrated schematically in FIG. 8 preferably comprise an orthogonal array of uniformly spaced-apart rows and columns of test probes. The spring-loaded plungers of the test probes 206 project above the surface of the grid base uniformly across the array of probes. Translator fixture 202 supports a conventional printed circuit board 208 under test (also referred to as a "unit under test" or "UUT"). The translator fixture serves as an interface between the test points 210 of the board 208 under test and the test probes 206 in the grid base 204. An external electronic test analyzer 212 is electrically connected to the test points 210 on the board 208 under test through test probes 206 and translator fixture 202, all as known in the art. The translator pins (of which there can be several types) are illustrated generally by 214.

The test analyzer 212 contains electronic interrogation circuits to electronically interrogate (stimulate) the test points 210 of the board 208 under test in order to determine whether the board 208 is operating properly. The electrical response signals produced as a result of such interrogation are compared to stored reference results obtained from simulation of board response and/or testing of a faultless master board. If the response signals and reference results match, it is assumed that the UUT is good.

Figure 11:
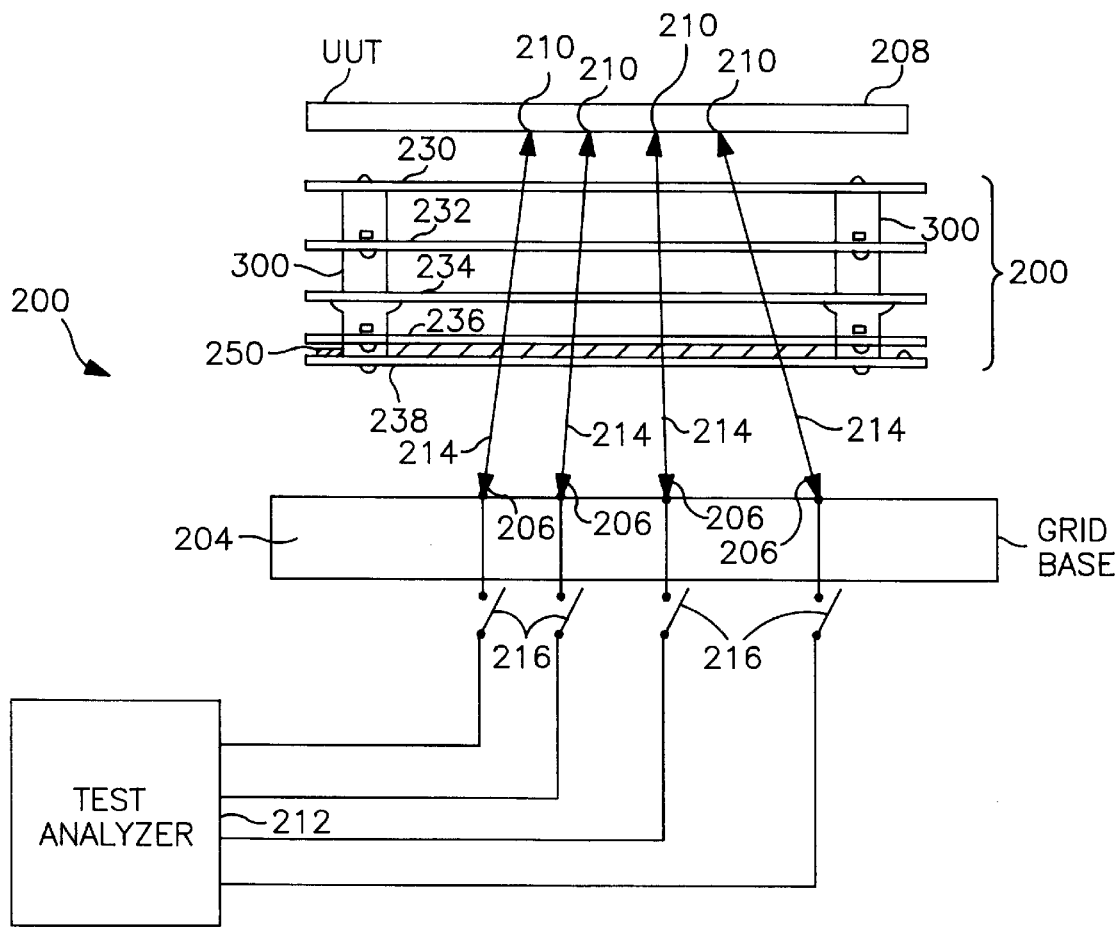
FIG. 11 is a schematic block diagram illustrating components of one embodiment of a translator pin fixture according to the present invention, which fixture is shown in use with an apparatus for testing a printed circuit board.
Figure 12:
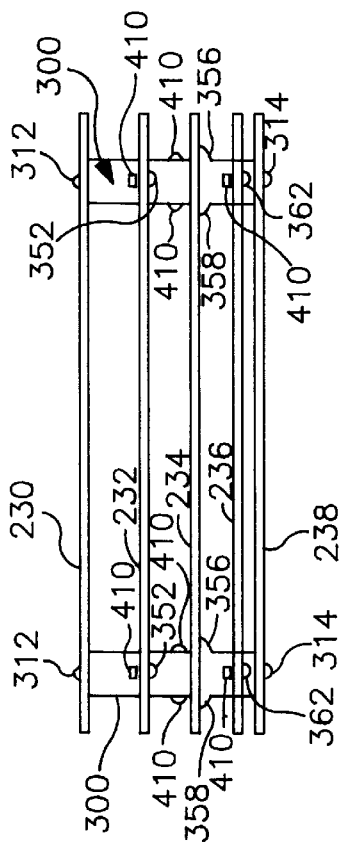
FIG. 12 is a side view of the embodiment of the translator pin fixture shown in FIG. 11.
Figure 13:
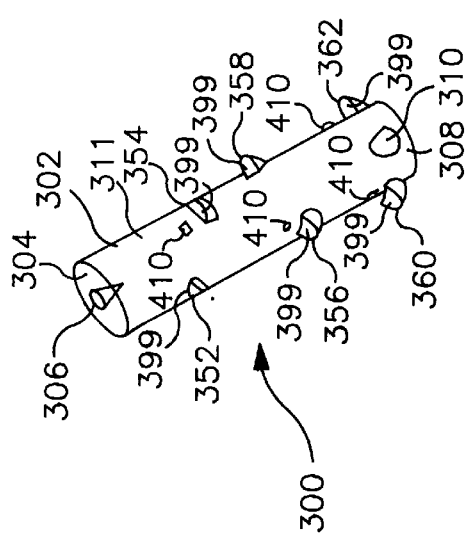
FIG. 13 is a perspective view of one support element of the embodiment of FIG. 12, in which view certain elements are shown in ghost to facilitate discussion of these elements.

Electronic interrogation circuits in apparatus 200 may comprise a plurality of printed circuit cards (sometimes called "switch cards") having electronic components and printed circuits for carrying out the electronic testing. Each test probe used in the test procedure is represented as being coupled to the test electronics through a corresponding switch 216 leading to the analyzer 212. It should be understood that although only six such switches 216 are shown in FIG. 11, any number of switches may be used, depending upon the number of testing points 210 on the board 208 under test.

In accordance with this embodiment of the present invention, translator fixture 202 includes a series of vertically spaced-apart and essentially parallel translator plates 230, 232, 234, 236, 238 which may include a top outermost plate 230, a plurality of intermediate plates 232, 234, and 236, and a bottom outermost grid facing plate 238. As will be described more fully below, the translator plates are supported in parallel spaced apart positions by supports (collectively referred to by numeral 300) that hold the fixture 202 together as a rigid unit. The fixture 202 also includes an array of standard translator pins such as tilt pins represented schematically at 214 extending through holes (not shown) in the translator plates. FIG. 11 represents only four translator pins for simplicity, but it should be understood that any number of such translator pins 214 may be used depending upon the number of contact points 210 to be tested on the board 208. The tilt pins extending through the base plate 238 of the fixture 202 are in alignment with the grid pattern of test probes 206 in the grid base 204. The top portions of the tilt pins, which extend through the outermost plate 230, are in an off-grid pattern for contacting test points 210 on the board 208. Preferably, the tilt pins 214 are straight, solid conductive pins, and extend through a pin retaining means 250. Preferably, retaining means comprises a plastic screen of the type disclosed in the copending application Ser. No. 08/662,671 entitled, "Retention Of Test Probes In Translator Fixture," filed on Jun. 14, 1996, and assigned to the Assignee of the instant application (which copending application is incorporated herein by reference), although if embodiment 202 is appropriately modified, other types of translator pin retaining means as are known in the art may be used without departing from the present invention. As disclosed in said copending application, the plastic screen retaining means 250 preferably is located between the lower most plates 236, 238 of the translator fixture 202, and includes a multiplicity of interstitial openings which provide for penetration for the translator pins 214. The plastic properties of said plastic screen retaining means 250 apply a partial compression force around the circumference of the translator pins 214 sufficient to retain the translator pins within the test fixture 202.

As noted above, translator fixture 202 comprises a plurality of support elements 300 mounted perpendicular to the translator plates for holding the translator plates together in spaced apart, essentially parallel relationship to each other. Preferably, in this embodiment, each of the supports 300 is of solid, one-piece construction, is made of molded plastic, and comprises a central, cylindrical portion 302 of substantially uniform transverse cross-section. Each of the supports 300 also includes a plurality of pairs of uniformly dimensioned half-round support tabs 352 and 354, 356 and 358, and 360 and 362, which are longitudinally spaced apart from each other along the outer surface 311 of the central portion 302, and have substantially flat support surfaces (collectively referred to by numeral 399) oriented normally to the outer surface of the 311 of the central portion 302 for engaging the undersides of plates 232, 234, 236, respectively, so as to support these plates in spaced apart, substantially perpendicular relationship with each other and plates 230, 238. Preferably, in each of the supports 300, the support portion 352 is angularly displaced from support portion 356 by 90 degrees along surface 311, support portion 354 is angularly displaced from support portion 358 by 90 degrees along surface 311, and support portions 360 and 362 are each angularly displaced from support portions 356 and 358, respectively, by about 30 degrees.

Each support 300 also comprises a top surface 304 having a top threaded mounting hole 306 formed therein and a bottom surface 308 having a bottom mounting hole 310 formed therein. Conventional screw means 312, 314 are passed through mounting holes 320, 322 of the top and bottom plates 230, 238, respectively, and are threaded into mounting holes 306, 310, so as to attach the top 304 and bottom 308 of each of the supports 300 to the top and bottom plates 230, 238 of the fixture 202, respectively.

Each support 300 also includes a plurality of pairs of uniformly dimensioned locking ridges (collectively referred to by numeral 410) which extend radially outwardly from the outer surface 311 of the central portion 302 of each of the supports 300 and are positioned on the surface 311 such that one locking ridge is positioned above each of the support surfaces 399. Preferably, support surfaces 399 extend a substantially greater distance from the surface 311 than the ridges 410 and are longitudinally spaced apart from the ridges 410 on the surface 311 by a distance equal to the thickness of the translator plates of the fixture 202.

Figure 14:
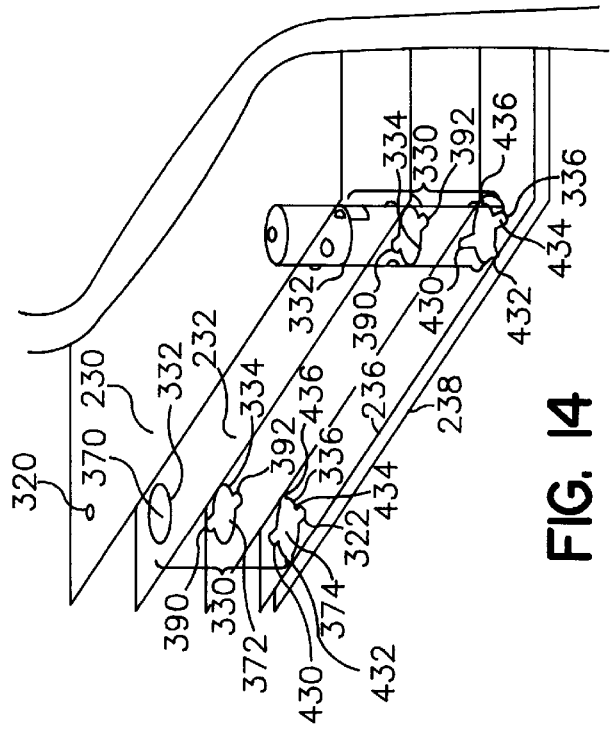
FIG. 14 is a side elevational view of the embodiment of FIG. 12, in which view one support element has been removed and certain elements are shown in ghost to facilitate discussion of these elements.
Figure 17:
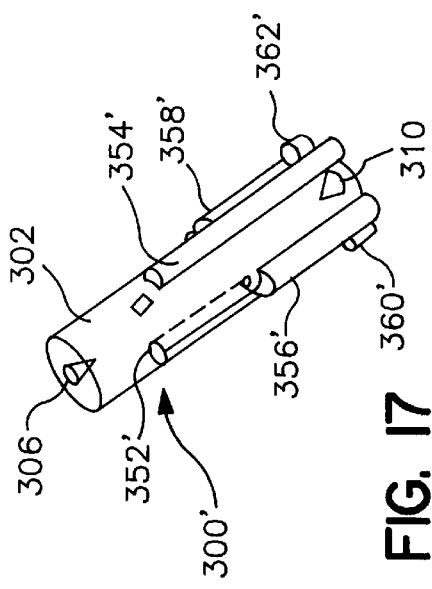
FIG. 17 is a perspective view of another type of support element for use in the embodiment of FIG. 12, in which view certain elements have been shown in ghost to facilitate discussion of these elements.
Figure 15:
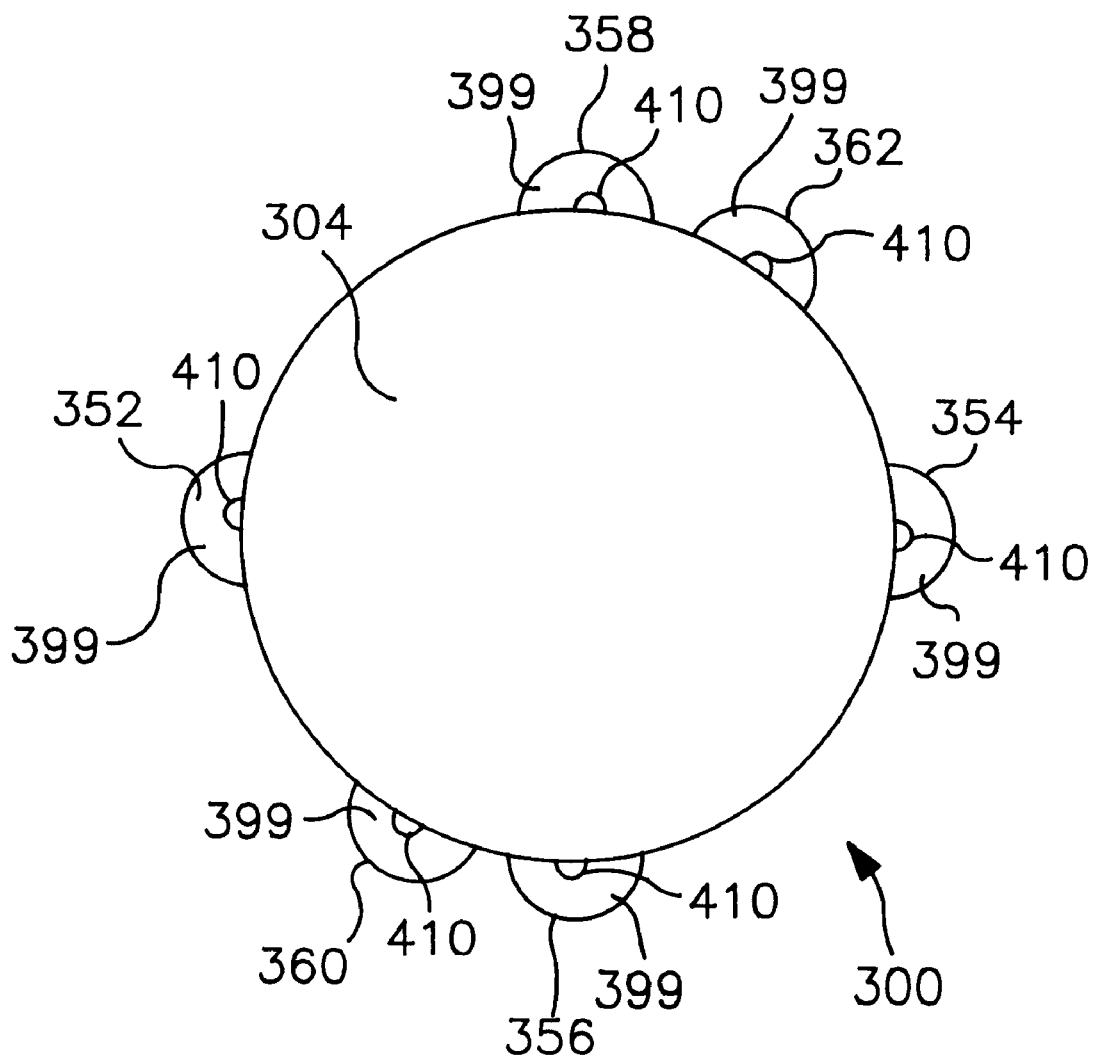
FIG. 15 is a top view of the support of FIG. 13.
Figure 16:
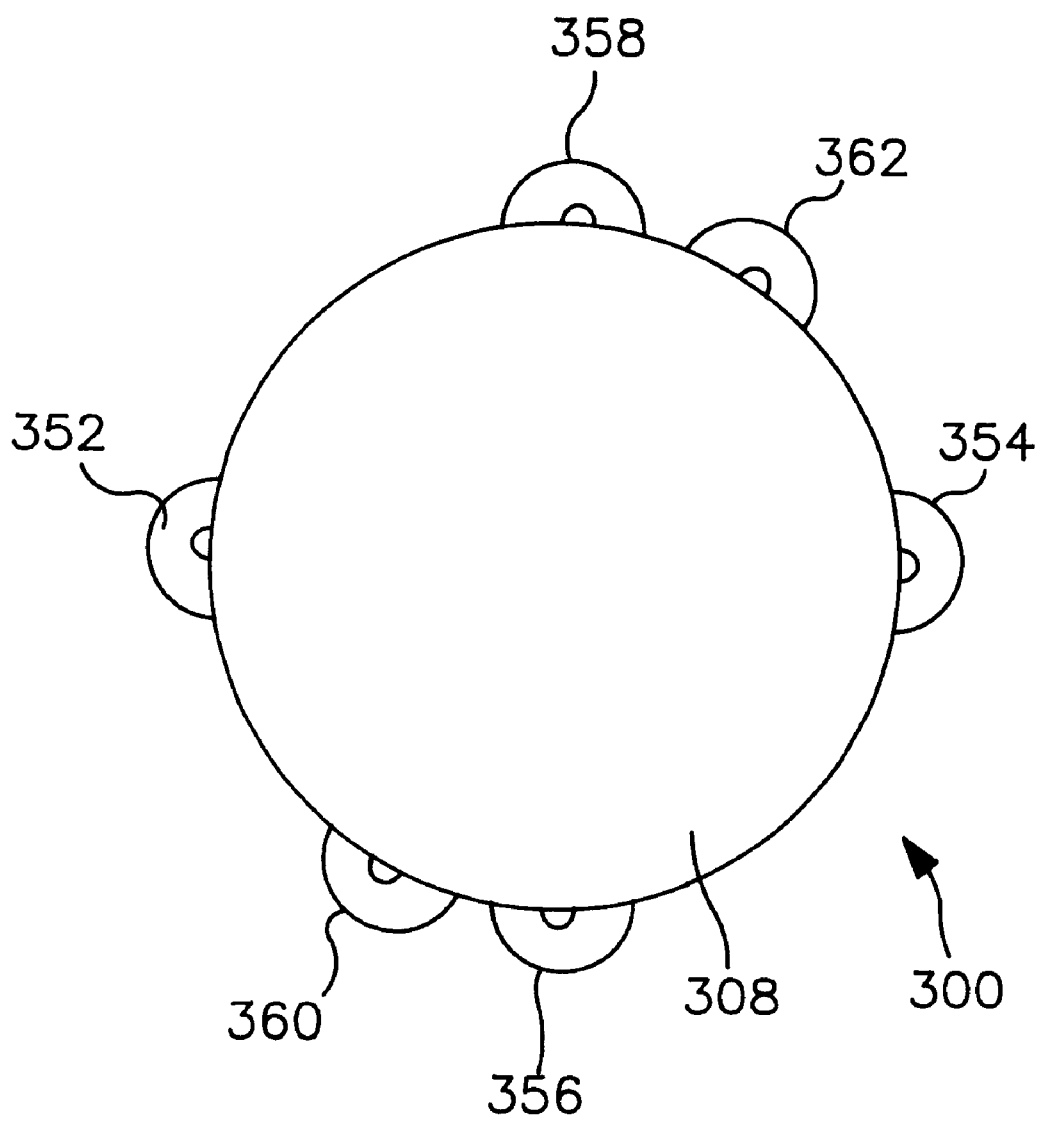
FIG. 16 is a bottom view of the support of FIG. 13.

Each of the supports 300 is mounted through a respective group of coaxially aligned holes (each of which group of holes is collectively referred to by numeral 330) through the intermediate plates 232, 234, 236 of the fixture 202. Each group of holes 330 includes holes 332, 334, 336 formed through translator plates 232, 234, 236, respectively. Preferably, holes 332, 334, 336 comprise central circular apertures 370, 372, 374, respectively, of substantially identical diameter. Extending outwardly from the periphery (i.e., circumference) 376 of hole 334 are peripheral apertures 390 and 392, and extending outwardly from the periphery of hole 336 are peripheral apertures 430, 432, 434, and 436. Apertures 390 and 392 diametrically oppose each other across the central aperture 372). Apertures 430 and 434, and 432 and 436, respectively, also oppose each other across the central aperture 374. Preferably, peripheral apertures 390, 392, 430, 432, 434, 436 are oversized compared to the support surfaces 399 so as to be able to fit over the support portions 352, 354, . . . 362 of the supports 300. Also preferably, all of the peripheral apertures are also of semi-circular shape and substantially uniform dimension. As seen in FIG. 14, the peripheral apertures are keyed to the supports, i.e. so as to selectively support the plates in spaced relationship as will become clear from the discussion following.

In this embodiment of the present invention, the support portion 352 of each of the supports 300 is aligned with peripheral apertures 390 and 430 of each of the groups of holes, and support portion 354 of each of the supports 300 is aligned with peripheral apertures 392 and 434 of each of the groups of holes. Also in this embodiment, support portions 356 and 358 of each of the supports are aligned with peripheral apertures 432 and 436, respectively, of each of the groups of holes.

In order to illustrate the ease with which the fixture 202 of this embodiment of the present invention may be constructed, one preferred method for constructing fixture 202 will now be briefly described. After drilling the holes in the plates for mounting the supports and for supporting the translator pins, the bottom of each of the supports 300 is affixed to the bottom plate 238 by conventional screw means. Thereafter, the translator pin retaining sheet is placed on the top surface of the bottom plate 238, and the translator pins are mounted through the translator pin supporting holes in the bottom plate 238 and through the pin retaining sheet. Intermediate plate 236 is then mounted onto support portions 360, 362 of the supports 300 by coaxially aligning the central portions of the supports with respective central apertures of the holes 336, aligning the support portions 352, 354, 356, and 358 of each of the supports with respective apertures 430, 432, 434, and 436 of the holes 336, and sliding plate 236 down from the top of each of the supports such that the support portions 352, 354, 356, and 358 of each of the supports pass through plate 236. Thereafter, the translator pins are mounted through the translator pin supporting holes in plate 236, and the next intermediate plate 234 is mounted onto the support portions 356, 358 of the supports 300. This is accomplished by coaxially aligning the central portions of the supports with respective central apertures of the holes 334, aligning the support portions 352, 354 of each of the supports with respective apertures 390, 392 of the holes 334, and sliding plate 234 down from the top of each of the supports such that the support portions 352, 354 pass through plate 234. The translator pins are then mounted through the translator pin mounted holes of plate 234, and plate 232 is mounted onto the supports 300. In order to accomplish this, the central portions of the supports are coaxially aligned with respective central apertures of the holes 332, and plate 232 is slid down from the top of each of the supports such that the support portions 352, 354 of each of the supports contact plate 232. The translator pins are then mounted through the translator pin mounting holes of plate 232. The topmost plate 230 is then attached to the top 306 of each of the supports 300 by conventional screw means, and the translator pins are mounted through the translator pin mounting holes of plate 230. The locking ridges 410 hold the intermediate plates 232, 234, 236 in snug, locked position against the support surfaces 399 of the supports, and are appropriately adapted to permit the plates to be forced past the ridges 410 during the aforesaid construction process, without damaging the ridges 410 or other parts of the fixture.

Thus, it is evident that there has been provided in accordance with the present invention a circuit board testing apparatus that fully satisfies both the aims and objectives hereinbefore set forth. It should be appreciated that although the present invention has been described in connection with preferred embodiments thereof, many modifications, alternatives, and variations will be apparent to those skilled in the art. For example, although the support portions of each of the supports 300 are described as comprising quarter-disk-shaped members, the support portions may be constructed differently without departing from the present invention. For example, as shown in FIG. 14, translator fixture 202 may be modified such that supports 300 are replaced with supports 300' wherein the support portions 352', 354', 356', 358', 360', and 362' comprise half-round columns which extend longitudinally from their respective support surfaces (collectively referred to by numeral 399') to the bottom end 308 of each of the supports 300'.

Other modifications are also possible. Thus, the present invention should not be viewed as being limited to only the specific embodiments and methods of use hereinbefore set forth, but rather, should be viewed as being of broad scope as only defined as set forth in the hereinafter appended claims.

What is claimed is:

1. A translator fixture comprising a plurality of translator plates for containing and supporting translator pins extending through the translator plates for positioning the translator pins for contacting test points on a circuit board, and a plurality of supports, each of said supports including a central portion and being mounted through a respective group of holes in said translator plates, each of said holes including a respective, substantially identically dimensioned central aperture that is oversized compared to the central portions of said supports, wherein at least one hole of each respective group of holes includes at least one peripheral aperture extending outwardly from a periphery of the central aperture of said one hole, each of said supports also includes at least first and second support surfaces extending from said central portion for supporting one translator plate and another translator plate, respectively, in spaced apart, substantially parallel relationship with each other, and said second support surface is undersized compared to and substantially aligned with said at least one peripheral aperture.

2. A translator fixture according to claim 1, wherein each of said supports also includes a plurality of locking ridges extending outwardly from said central portion and spaced apart from respective support surfaces.

3. A translator fixture according to claim 1, wherein said one and other translator plates are in-between outmost translator plates of said fixture.

4. A translator fixture according to claim 1, wherein the support surfaces extend radially outwardly from central portions of the supports.

5. A translator fixture according to claim 1, wherein each of said supports is of one-piece construction.

6. A translator fixture according to claim 1, wherein said supports are oriented perpendicular to the translator plates.

7. A translator fixture according to claim 1, wherein each of said supports includes at least two pairs of support surfaces, at least one of said pairs is for supporting said one translator plate and at least one other of said pairs is for supporting said other translator plate, said one hole includes at least two peripheral apertures extending outwardly from the central aperture of said one hole, and each of said peripheral apertures is substantially aligned with a respective support surface of said at least one other of said pairs of support surfaces.

8. A translator fixture according to claim 7, wherein said pairs of support surfaces are angularly displaced from each other on said central portion.

9. A translator fixture according to claim 8, wherein the support surfaces comprising each of said pairs of support surfaces are angularly displaced from each other on said central portion by substantially 180 degrees.

10. A translator fixture according to claim 1, wherein said at least one peripheral aperture is substantially aligned with said second support surface.

11. A translator fixture according to claim 1, wherein one translator plate is positioned below said other translator plate in said translator fixture.

12. A translator fixture according to claim 1, wherein top and bottom translator plates are mounted respectively to opposite end surfaces of said supports.

13. A translator fixture according to claim 1, wherein in each support, said first support surface is part of a first support portion of each said support which extends from said one translator plate to an end of each said support, and said second support surface is part of a second support portion of each of said support which extends from said other translator plate to said end of each said support.

14. A translator fixture according to claim 1, wherein each of said supports also includes at least one other support surface for holding a third translator plate in spaced-apart, substantially parallel relationship with said one and other translator plates, each of said groups of holes includes another hole formed in said other translator plate having at least one peripheral aperture extending outwardly from the central aperture of said other hole, and said third support is substantially aligned with and undersized compared to the peripheral apertures of said one and other holes.

15. A translator fixture according to claim 14, wherein said one and other holes each comprise a plurality of peripheral apertures.

16. A translator fixture according to claim 14, wherein said plurality of peripheral apertures are identically dimensioned.

17. A translator fixture comprising a plurality of translator plates for containing and supporting translator pins extending through the translator plates for positioning the translator pins for contacting a unit under test, and at least one support mounted through holes in at least certain of said translator plates, said at least one support including a central portion and a plurality of support portions extending radially outwardly from said central portion, said at least one support portion being adapted to contact and support said at least certain translator plates in spaced apart, essentially parallel relationship with each other, said holes through said at least certain translator plates each including a central aperture that is oversized compared to said central portion, and at least one of said holes through said at least certain translator plates including a peripheral aperture extending outwardly from the central aperture of said at least one hole, said peripheral aperture being oversized with respect to at least one of said support surfaces and also being aligned therewith.

* * * * *